United States Patent
Simpson

(10) Patent No.: US 10,408,872 B2
(45) Date of Patent: Sep. 10, 2019

(54) DATA MEASUREMENTS AND METHODS

(71) Applicant: Maury Microwave, Inc., Ontario, CA (US)

(72) Inventor: Gary R. Simpson, Fontana, CA (US)

(73) Assignee: Maury Microwave, Inc., Ontario, CA (US)

( * ) Notice: Subject to any disclaimer, the term of this patent is extended or adjusted under 35 U.S.C. 154(b) by 410 days.

(21) Appl. No.: 14/921,763

(22) Filed: Oct. 23, 2015

(65) Prior Publication Data

US 2016/0124032 A1 May 5, 2016

Related U.S. Application Data

(60) Provisional application No. 62/074,466, filed on Nov. 3, 2014.

(51) Int. Cl.
*G01R 29/26* (2006.01)

(52) U.S. Cl.
CPC .................... *G01R 29/26* (2013.01)

(58) Field of Classification Search
CPC ...................................... G01R 29/26
USPC ........................................... 702/69
See application file for complete search history.

(56) References Cited

U.S. PATENT DOCUMENTS

| | | | |
|---|---|---|---|
| 8,786,293 B1 | 7/2014 | Tsironis | |
| 8,892,380 B2 | 11/2014 | Simpson | |
| 8,890,750 B2 | 12/2014 | Simpson | |
| 9,500,688 B2 * | 11/2016 | Boglione | G01R 29/26 |
| 9,541,592 B1 * | 1/2017 | Tsironis | G01R 29/26 |
| 2008/0238441 A1 * | 10/2008 | Rhymes | G01R 29/26 324/601 |
| 2010/0030504 A1 * | 2/2010 | Simpson | G01R 29/26 702/69 |
| 2012/0049970 A1 | 3/2012 | Simpson | |

FOREIGN PATENT DOCUMENTS

| | | |
|---|---|---|
| JP | 2005165871 A | 6/2005 |
| WO | 2013031874 A1 | 3/2013 |

OTHER PUBLICATIONS

R. Remi Tuijtelaars, BWS TestSystems & Consulting bv: Overview of Device Noise Parameter Measurement Systems; Oct. 23, 2001, XP055246871, retrieved from the Internet: URL: http://www.imst.de/itg9_1/vortraege/oktober2001/tuijtelaars_vortrag.pdf.

(Continued)

*Primary Examiner* — Ricky Ngon
(74) *Attorney, Agent, or Firm* — Larry K. Roberts

(57) ABSTRACT

Systems and methods of measuring and determining noise parameters. An exemplary method measures noise data and determines element values of a device noise model for a device under test (DUT), using a test system including an impedance tuner coupled to an input of the DUT for presenting a controllable variable impedance to the DUT and a noise receiver coupled to an output of the DUT. Noise data is measured as a function of at least one measurement parameter. The measured data includes raw noise data read from the noise receiver, and is used to determine element values of the device noise model. The system may include a database of device models.

23 Claims, 14 Drawing Sheets

(56) References Cited

OTHER PUBLICATIONS

Notification of, and International Search Report and the Written Opinion of the Interational Searching Authority, re International Patent Application No. PCT/US2015/057531, dated Feb. 11, 2016.
"Modeling of Noise Parameters of MESFET'S and MODFET'S and Their Frequency and Temperature Dependence," Marian W. Pospieszalski, 1989 IEEE MTT-S Digest, pp. 385-388.
"A New Method to Calculate the Pospieszalski Model Noise Parameters for a HEMT Transistor," Julian Chereches et al., International Symposium for Design and Technology of Electronic Packages, 14th Edition, ISSN 1843-5122, pp. 101-105, 2008.
"FET Noise Model Extraction Methods," J. Stenarson, N. Wadefalk, M. Garcia, I. Angelov, H. Zirath; 30th European Microwave Conference, 2000.

* cited by examiner

DATA MEASUREMENTS AND METHODS

CROSS-REFERENCE TO RELATED APPLICATION

This application claims the benefit of U.S. Provisional Application No. 62/074,466 filed Nov. 3, 2014, the entire contents of which are hereby incorporated by reference.

BACKGROUND

Minimizing noise contributions of devices is important in RF circuits. This starts with the device design, and continues with the circuit design and system design. The parameters used to design or evaluate the noise performance of devices and circuits are called noise parameters. Noise parameters, used with s-parameters, provide low noise designers the information that they need.

Noise parameters typically include a set of values that describe how the noise figure of a device varies with impedance match. Note that in this document, impedance and gamma may be used interchangeably. As is known in the art, they contain equivalent information.

The noise parameters generally vary with measurement parameters such as frequency, bias, or temperature which are associated with a Device Under Test (DUT). The measurement parameters are independent stimulus values that setup specific measurement conditions. Device parameters comprise noise parameters and s-parameters, and are values that are typically measured for each desired set of measurement parameters. Gain parameters are derived from s-parameters, so may also be considered part of the device parameters.

There are different mathematical forms of the noise parameters, but generally include a set of four (4) scalar values. A commonly used set is:
1. F min=minimum noise figure.
2. Gamma_opt magnitude=magnitude of gamma_opt, the optimum source gamma that will produce F min
3. Gamma_opt phase=phase of gamma_opt, the optimum source gamma that will produce F min
4. rn=equivalent noise resistance, which determines how fast the noise figure will change as the source gamma moves away from Gamma_opt.

With this set of noise parameters, the noise figure of the device for any source gamma is then generally described by the equation $$F=F\min+4*rn*|\text{gamma\_opt}-\text{gamma\_s}|^2/(1+|\text{gamma\_opt}|^2*(1-|\text{gamma\_s}|^2))$$

Where gamma_s=source reflection coefficient seen by the DUT and F=Noise figure.

Other noise parameter forms include a correlation matrix (of which there are multiple configurations), and a set with forward and reverse noise parameters used by the National Institute for Standards and Technology (NIST). Generally, all of the noise parameter forms contain the same basic information. So if one form of the noise parameters is known, the noise parameters can be converted to any other form with a math formula.

Noise parameters are commonly determined by measuring the DUT under multiple impedance conditions, in a setup similar to that shown in FIG. 1. The bias system is used to apply the desired DC voltages and currents to the DUT. Then, the input and output switches are set to connect the DUT to the network analyzer, and the s-parameters of the DUT are measured with the impedance tuner set to a Z0 or matched condition. Next, the input and output switches are set to connect the DUT to the noise source and the noise receiver. The impedance tuner is then sequentially set to multiple source impedances and the raw noise data is measured with the noise receiver for each impedance setting. The raw noise data is data that is read directly from the noise receiver and other equipment that may also be used in the setup. For example, bias voltages and currents may be read from the power supplies which provide the DUT bias, or they may be read with separate voltmeters or current meters.

An alternate setup for measurement of noise parameters is shown in FIG. 2. Instead of using a noise source, a power meter is used to calibrate the noise receiver inside the network analyzer.

Another alternate setup for measurement of noise parameters is shown in FIG. 3. Here, the RF source in the network analyzer is used to create a signal, and the receivers inside the network analyzer are setup to measure the signal to noise ratios of the DUT. The noise figure of the DUT is the signal to noise ratio on the input divided by the signal to noise ratio on the output. In a practical device the output signal to noise ratio will always be smaller than the input signal to noise ratio because of the noise added by the device.

The raw noise data may be collected using the standard method, which is to measure the raw noise data at every impedance at one measurement parameter value, such as frequency. When the data collection is finished for that measurement parameter value, the process is then repeated for other measurement parameter values.

The raw noise data may also be collected using the newer fast method, which is to set the source impedance tuner to one state, and measure the raw noise data for a sweep of a measurement parameter value, for example at multiple values of frequency. The impedance tuner is then set to another state, and the raw data is measured for another sweep of the measurement parameter value. This is repeated until the raw data has been collected for every desired source impedance. With this fast method, the measurement parameter sweep could also include different values of multiple measurement parameters, such as frequency, temperature, or bias values. See, U.S. Pat. No. 8,892,380, the entire contents of which are incorporated herein by this reference.

The bias values that may be used as swept measurement parameters depend on the type of device. For example, a device such as an FET will typically be biased with two voltages, one on the output terminal of the device, and one on the input terminal of the device. Either of these voltages may be used as a swept measurement parameter during the noise parameter measurements. The input or output current may also be used as a measurement parameter in some cases. Other devices may have additional control terminals, so additional voltage or currents may be used as measurement parameters in that case. The DC bias is typically provided by using power supplies connected to the DUT using bias tees.

After collecting the data for all the desired impedance settings, the noise parameters are determined by fitting the data to the noise equations. Since the noise parameters comprise four scalar values, a minimum of four measurements are required to determine the four values. However, the noise measurement is very sensitive and measurement equipment is never perfect, so normally some small errors are included in the data. To minimize the effect of these errors, the measurement is commonly done at more than four impedance settings. This results in over-determined data which can be reduced using Least Means Squares (LMS) methods which reduce sensitivity to some of the errors. But in any practical measurement setup, there are always some residual errors. If the measurement is done at multiple frequencies, for example, the error at one frequency will be different than the error at the next frequency. In fact, the error at adjacent frequencies could move in the opposite direction, so a plot vs. frequency will show some scatter, as shown in the plots of F min and gamma_opt vs. (i.e. as a function of) frequency in FIGS. 4 and 5. The same thing can happen vs. other measurement parameters, such as a measurement vs. DC bias or temperature, for example.

This is a significant limitation of the prior art, that the noise parameter solution is determined independently for every measurement parameter value, such as frequency or bias for example. Because noise measurements are very sensitive, the noise parameters thus determined can show significant scatter vs. a measurement parameter such as frequency. However, this scatter of data comes from the measurement process, not from the device, so it is not a true representation of the device.

In the prior art, it is common to apply smoothing to plotted data after the noise parameter determination is complete, as shown in FIG. 6. This is done because the general knowledge of the device operation indicates that the true data should be smooth. But FIG. 6 still shows that the real measured values of F min have scatter. This method of smoothing data tries to account for the known fact that F min should be smooth with frequency, but is still limited by the scatter and the bandwidth of the measurement. Often the scatter is not symmetrical, and then smoothing of the scattered data will give the wrong slope to the plot. Also, measurements over a narrow band will give a slope that is very sensitive to error.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
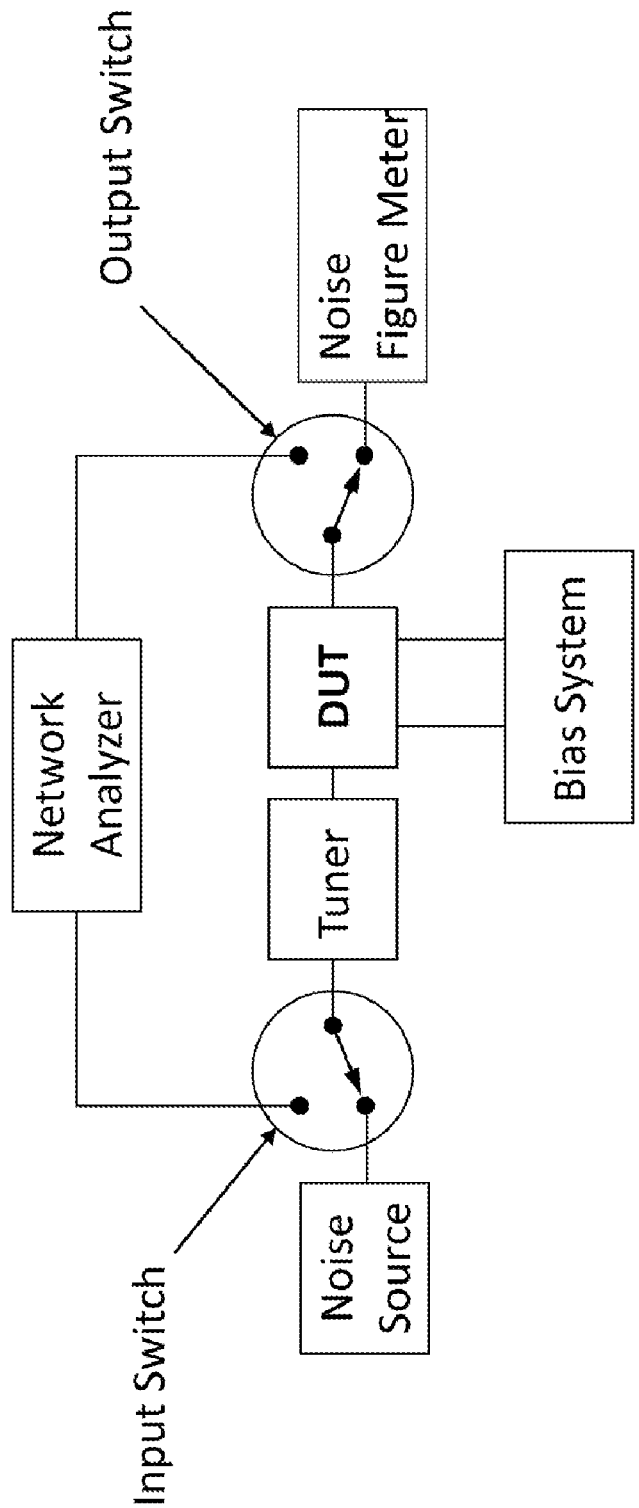
FIG. 1 is a schematic block diagram illustrating a typical noise parameter measurement setup using a noise source.
Figure 2:
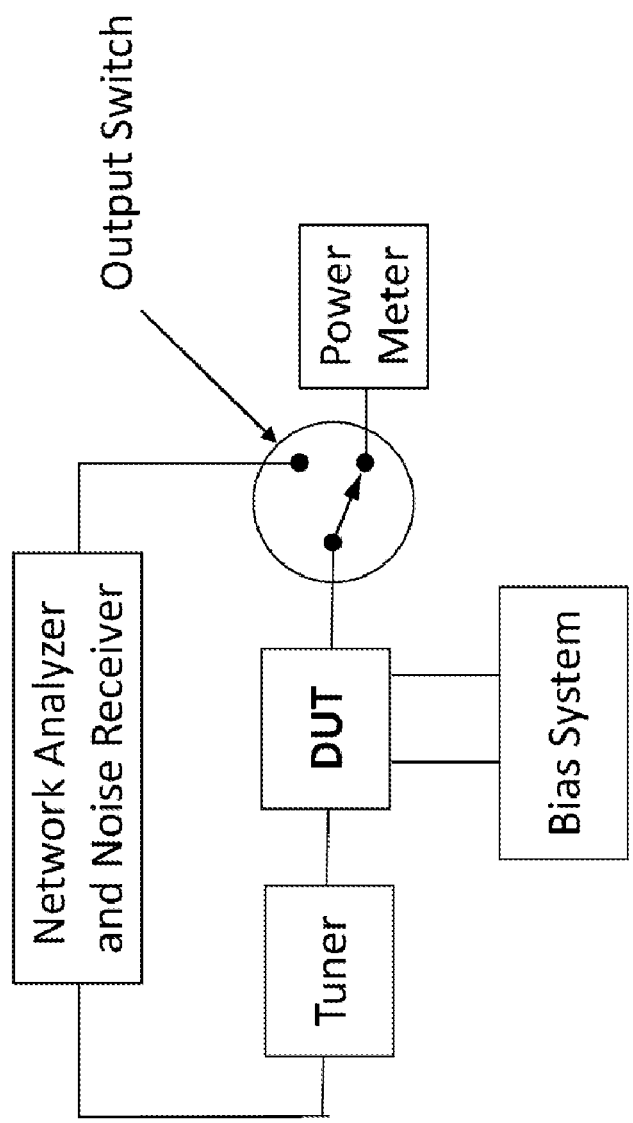
FIG. 2 is a schematic block diagram illustrating a typical noise parameter measurement setup using a power meter.
Figure 3:
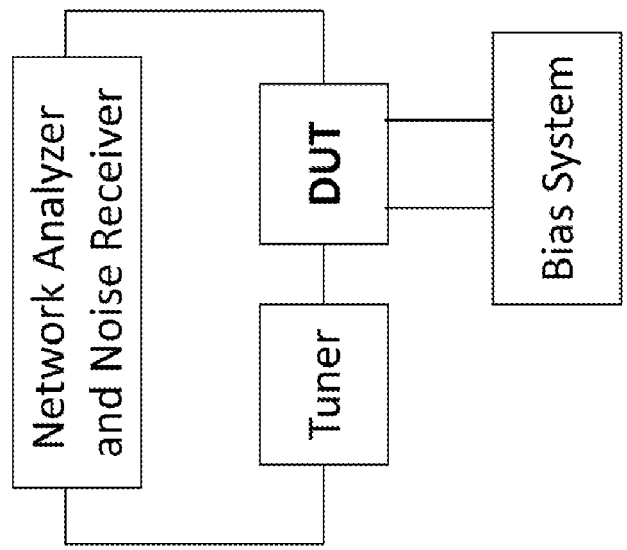
FIG. 3 is a schematic block diagram illustrating a typical noise parameter measurement setup using an RF source and receivers to measure the signal to noise ratios.
Figure 4:
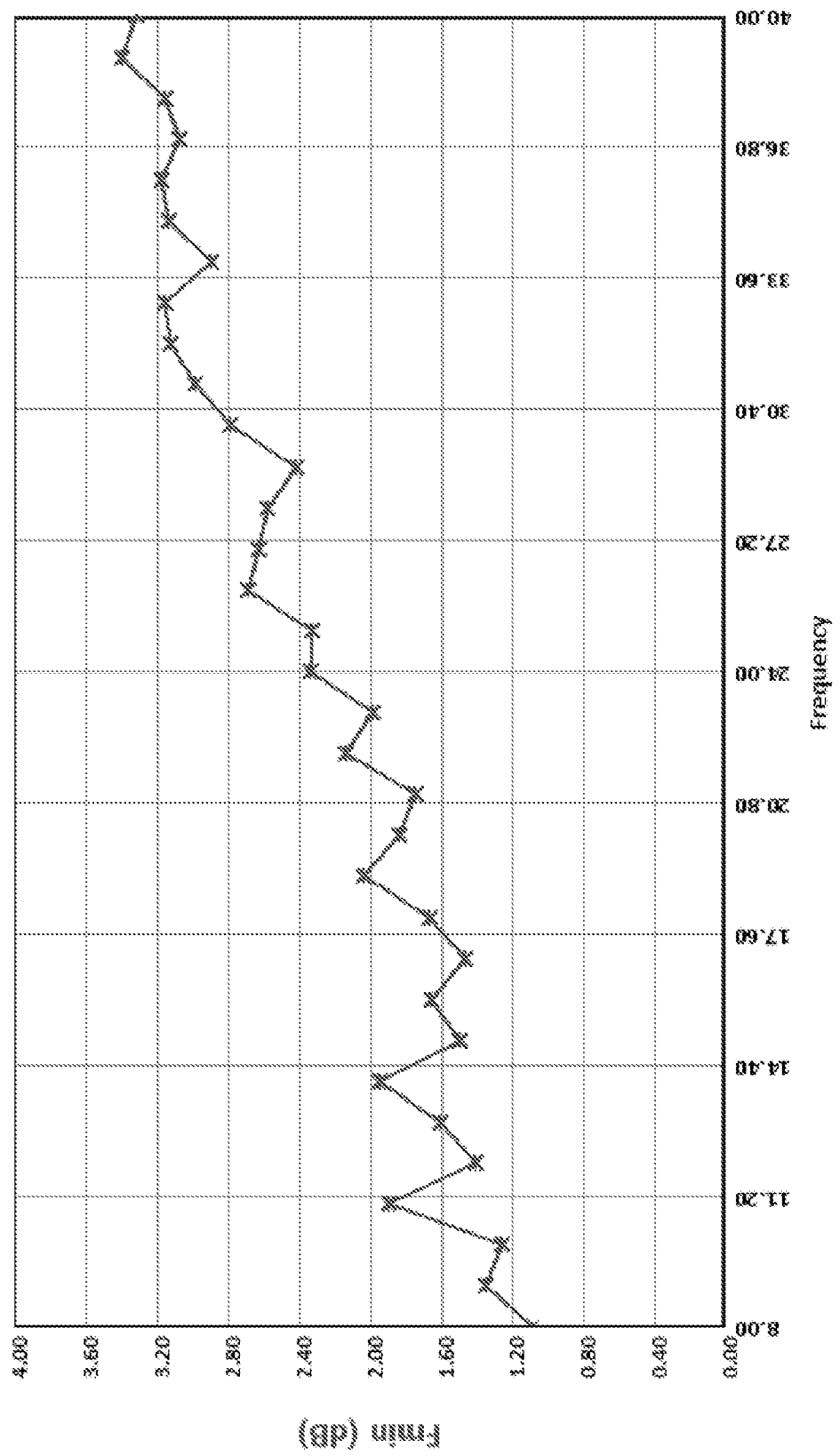
FIG. 4 is typical plot of measured F min vs. frequency which includes some scatter.
Figure 5:
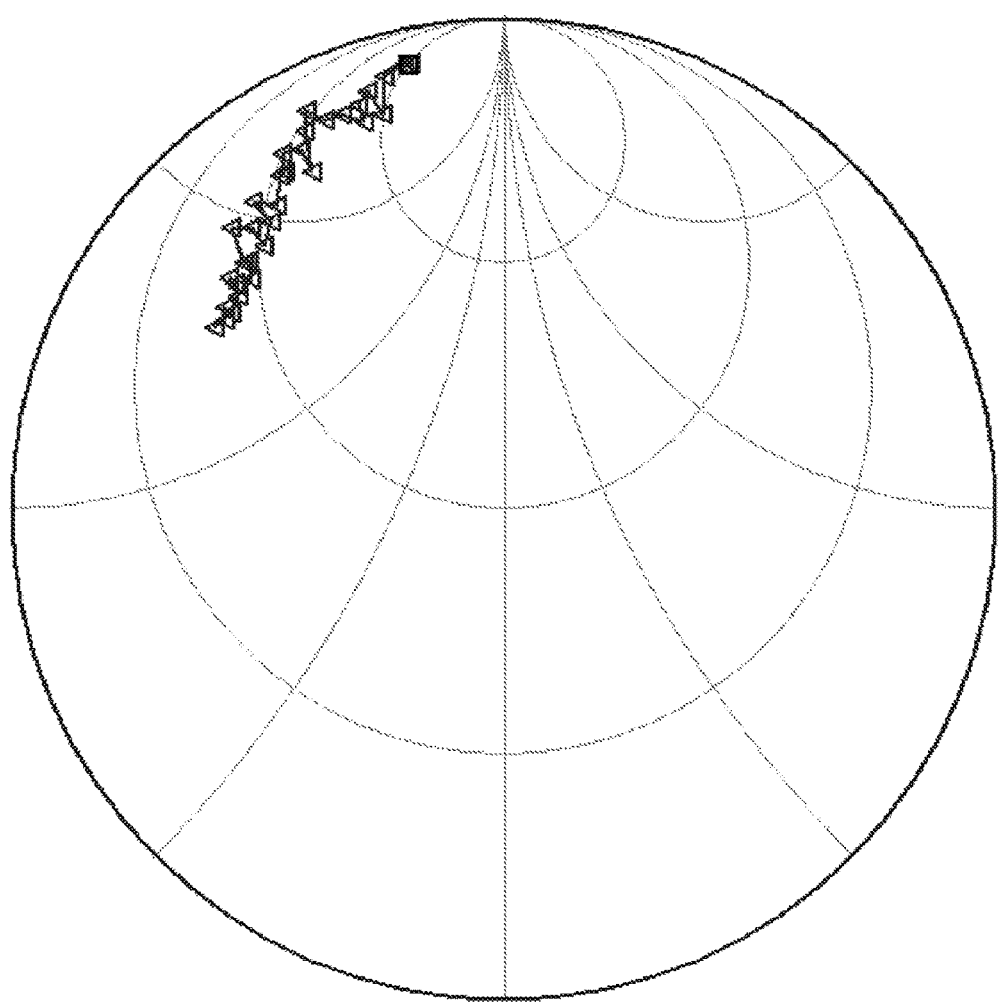
FIG. 5 is typical plot of measured gamma_opt vs. frequency which includes some scatter.

In the following detailed description and in the several figures of the drawing, like elements are identified with like reference numerals. The figures are not to scale, and relative feature sizes may be exaggerated for illustrative purposes.

Another way of representing the noise performance of a device is with a device model. Device models are often developed for use in circuit simulators. One advantage of a device model, for example, is that calculation of device or circuit performance is not limited to the measurement parameter range at which the device parameters were measured. A compact device model may consist of an equivalent circuit that will simulate the device performance, and the element values of that equivalent circuit are often determined by adjusting the values until the calculated performance matches DC and small signal measured data, including noise parameters.

Another important advantage of a device model is that it does not calculate the device performance independently at each value of a measured parameter such as frequency. The model will typically predict that the noise contribution varies with frequency in a smooth manner, without the scatter that is typical with measured noise parameters. Determination of the noise part of a device model is often done using noise figure or noise parameters which were previously calculated from raw noise data.

Figure 7:
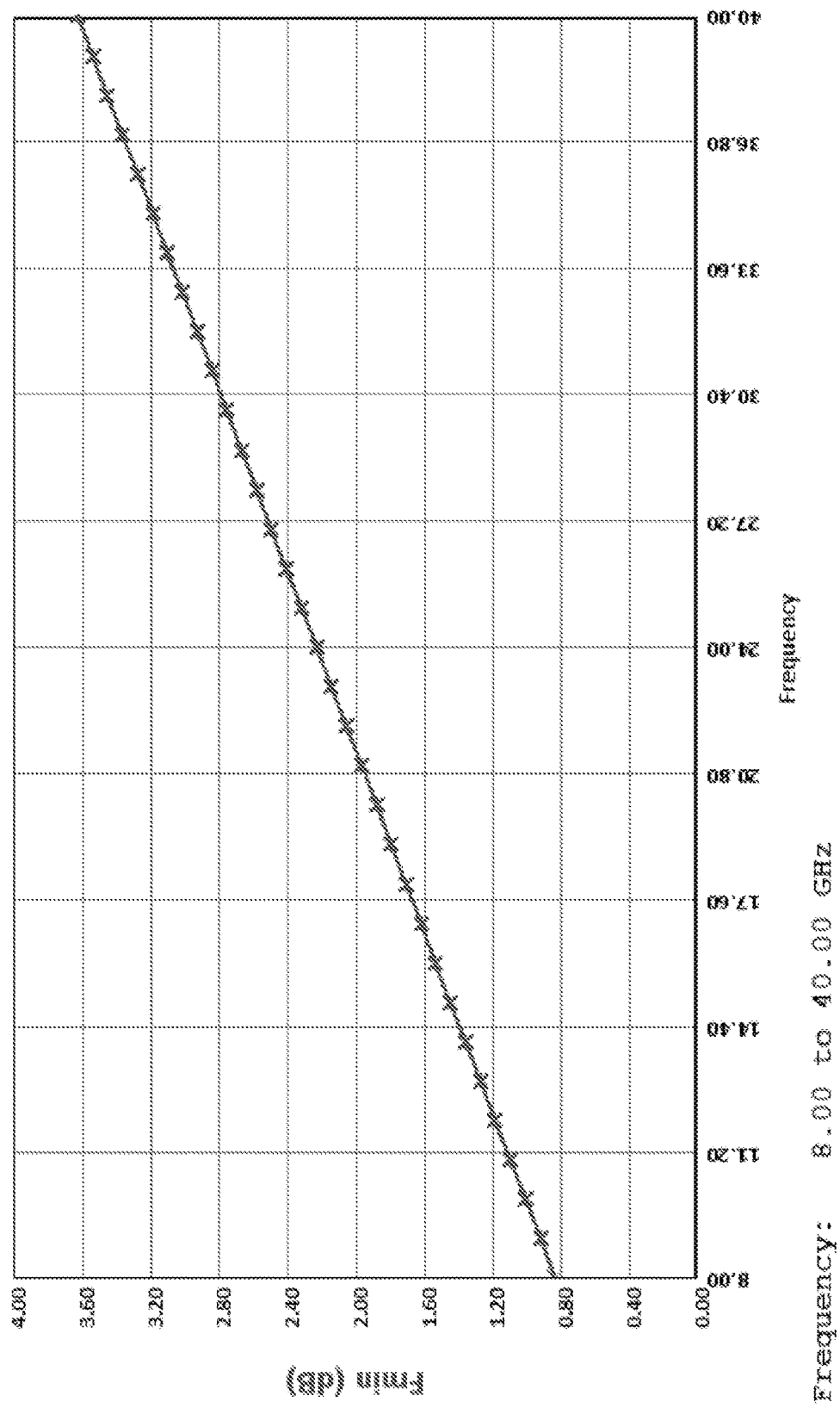
FIG. 7 is a plot of F min vs. frequency calculated from a model.
Figure 8:
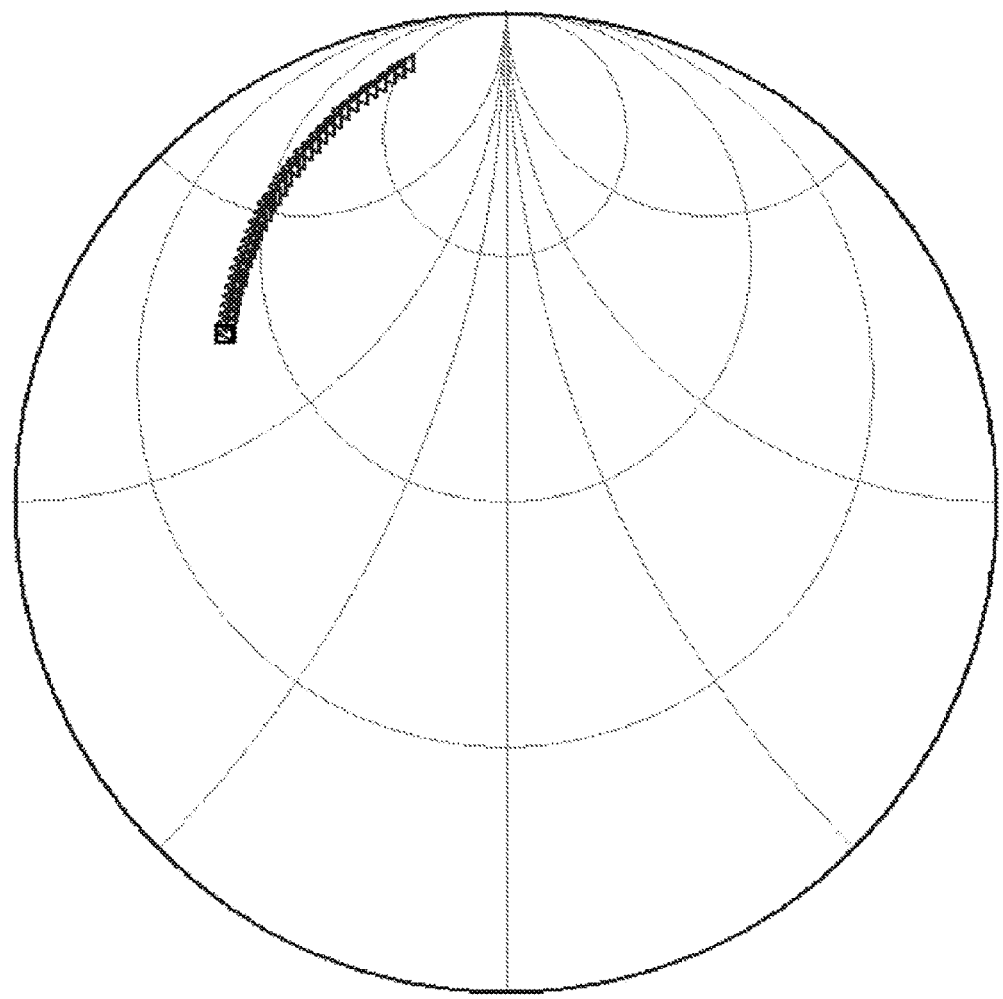
FIG. 8 is a plot of gamma_opt vs. frequency calculated from a model.
Figure 9:
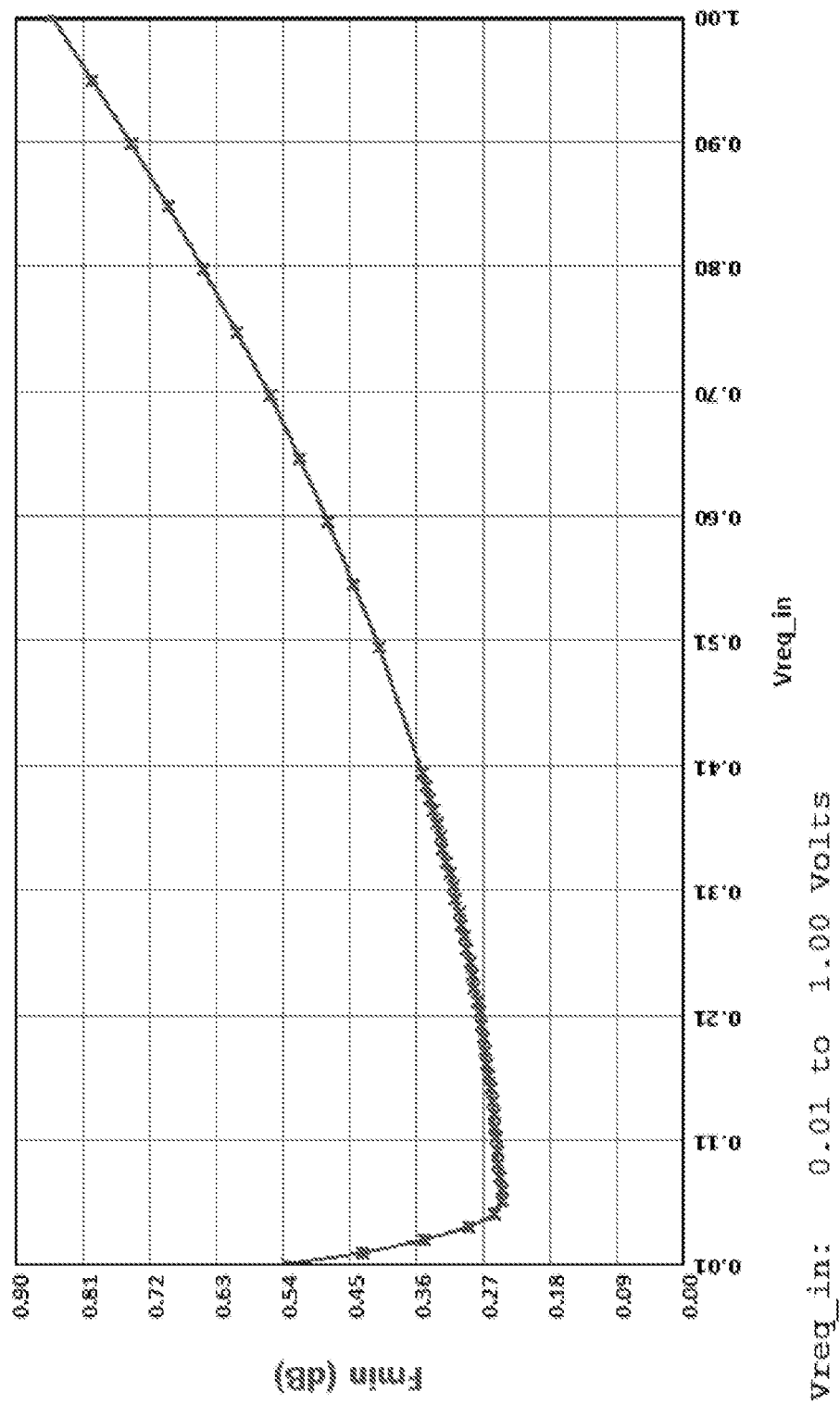
FIG. 9 is a plot of F min vs. input bias voltage calculated from a model.

There is known device information that is not used in the prior art to determine measured noise parameters. Even without knowing any element values of a device model, the general nature of the device operation can be known. For example, a model structure may indicate that the F min value vs. frequency should be smooth and monotonically increasing with increasing frequency. Another example is that a model may indicate the value of F min at DC (where frequency=0). Another example is that a model may show that some of the noise parameters should fit a polynomial curve vs. frequency or bias. A simple polynomial curve could even be considered to be a simple model. FIGS. 7 and 8 are examples of F min and Gamma_opt calculated from a model, showing the smooth response vs. frequency. FIG. 9 shows an example of F min calculated from a model vs. DC bias.

The known or assumed information about a device may be represented by different types of models. A "response model" would be a simple model that describes the general nature or response of the device operation. For example, It might be known or assumed that a noise parameter value (such as F min) of a device should be smooth vs. a measurement parameter (such as frequency). If this smooth behavior is modeled as a polynomial function, then the model parameters (model element values) would be the polynomial coefficients. An "equivalent circuit model" would be a model that represents the device with a schematic of electrical components such as resistors, capacitors, inductors, and current generators, as in FIGS. 10 and 11. The electrical values (i.e. resistance, capacitance, or inductance, for example) of each circuit element would be the model parameters. The electrical value of a circuit element may be fixed, or it may be represented by an equation. In the latter case, each value that goes into the equation would be a model parameter or model element value. A "hybrid model" may use a response model to describe part of the device, and an equivalent circuit for another part of the device. For example, a hybrid model could use an equivalent circuit for the parasitic capacitance and inductance, and a response model for the intrinsic device.

Embodiments of the invention improve on the prior art by using known information about device performance vs. a measurement parameter or multiple measurement parameters, in addition to the measured raw noise data, to determine noise parameters. Examples of the measurement parameter include frequency, DC bias, or temperature. A wide range of information may be used, quantified by an appropriate model such as a response model, an equivalent circuit model, or a hybrid model. Other model types may alternatively be used.

Figure 6:
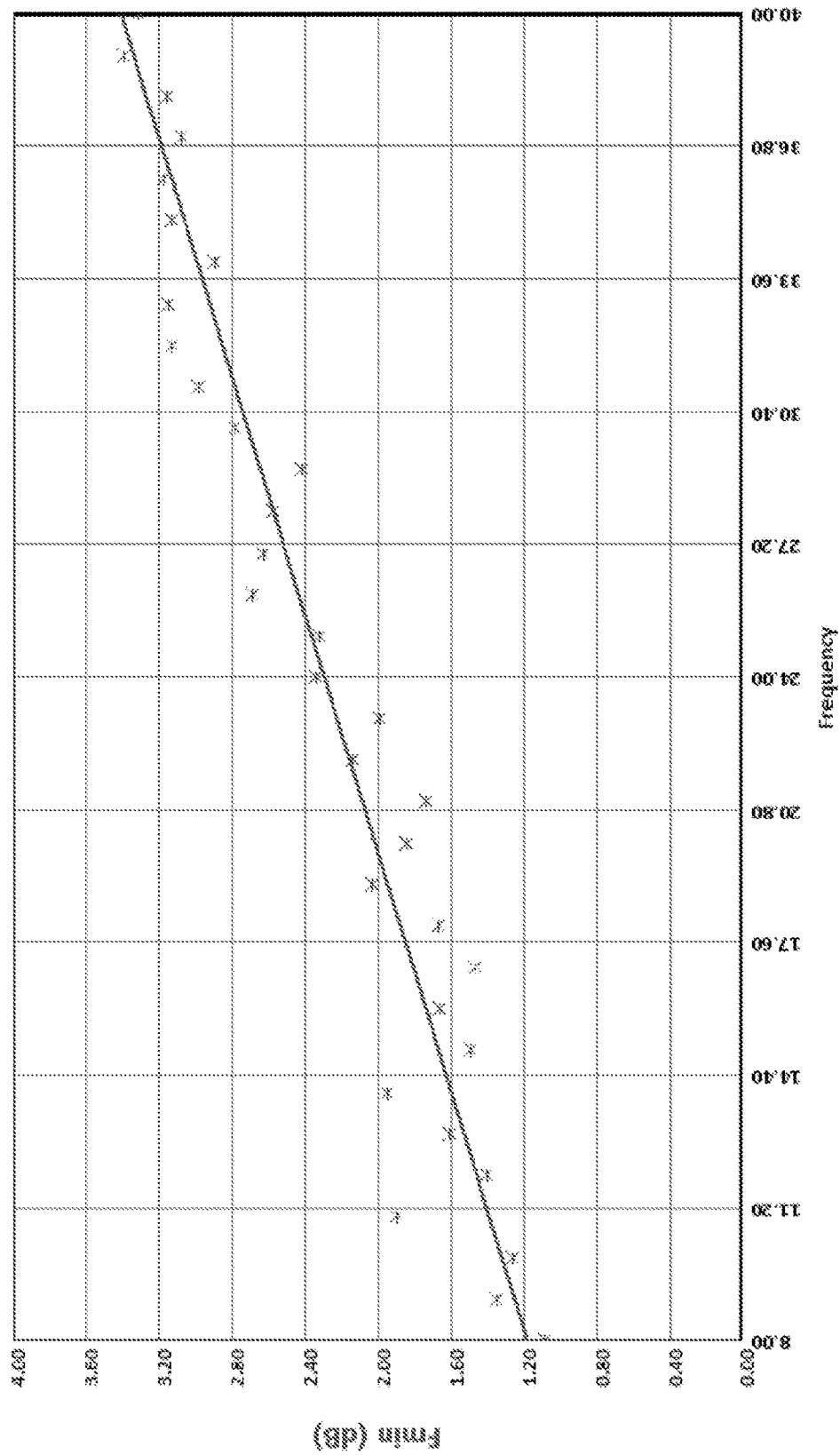
FIG. 6 is typical plot of measured F min vs. frequency with smoothing applied, but the measured F min includes some scatter.

Exemplary embodiments of the method are different from conventional smoothing. For example, the data in FIGS. 6 and 7 come from the same raw data, but the slope of the smoothed F min vs. frequency in FIG. 6 is different from F min vs. frequency from the model in FIG. 7. Trying to use additional known information to post process the data with smoothing will often give poor or wrong results, and is not the same as using the additional known information to solve directly for the noise parameters. So even though post processed smoothing of noise parameters was known in the prior art, using additional known information like this (smoothness vs. frequency) about the device operation vs. a measurement parameter has not been used in the prior art for the measurement of the noise parameters.

To illustrate the principle of an exemplary embodiment of this invention, let us use a simple response model that says F min vs. frequency is a straight line rising with frequency, and zero when frequency is zero. This leads to the following equations:

$$F\ min=Fa*\text{Frequency}$$

$$F=F\ min+4rn|\text{gamma\_s}-\text{gamma\_opt}|^2/(|1+\text{gamma\_opt}|^2(1-|\text{gamma\_s}|^2))$$

The first equation is additional information that was not used in the prior art. These two equations may be combined to give the following equation:

$$F=Fa*\text{Frequency}+4rn|\text{gamma\_s}-\text{gamma\_opt}|^2/(|1+\text{gamma\_opt}|^2(1-|\text{gamma\_s}|^2))$$

In this example, Fa is the slope of F min vs. frequency, and is an element value of the model. Fa is independent of frequency, so if measurements are made at five frequencies, gamma_opt magnitude should be determined at all five frequencies, gamma_opt phase at all five frequencies, rn at all five frequencies, but only one value of Fa needs to be determined instead of F min at all five frequencies. Once the value of Fa is known, F min may be calculated from the first equation. If over-determined data, i.e. more data than theoretically required to obtain a more robust result, is used with LMS reduction, the best fit will be obtained for gamma_opt and rn vs. frequency, and guarantee that F min meets the model of a straight line vs. frequency, and zero when frequency is zero.

In this simple example, the amount of variables that must be determined has been reduced, which simplifies the work. Results that match additional known information about the DUT are also obtained.

The response model of this illustration may be extended to include gamma_opt. Now a model is used that says F min vs. frequency is a straight line rising with frequency, and zero when frequency is zero, as in the prior illustration. In addition, this model says that gamma_opt magnitude is 1 when frequency is zero, and decreases with frequency by a second order polynomial. Also this model says that gamma_opt phase is zero degrees when frequency is zero, and moves in a straight line vs. frequency, becoming more positive as frequency increases. This leads to the following equations:

$$F\ min=Fa*\text{Frequency}$$

$$\text{Gamma\_opt magnitunde}=1-Gma*\text{frequency}-Gmb*\text{frequency}*\text{frequency}$$

$$\text{Gamma\_opt phase}=Gp*\text{frequency}$$

$$F=F\ min+4rn|\text{gamma\_s}-\text{gamma\_opt}|^2/(|1+\text{gamma\_opt}|^2(1-|\text{gamma\_s}|^2))$$

In this response model example, three new equations with additional information have been used that was not used in the prior art. The variable Fa is the slope of F min vs. frequency, as before. Gma is the first order coefficient of the gamma_opt_mag polynomial vs. frequency. Gmb is the second order coefficient of the gamma_opt_mag polynomial vs. frequency. Gp is the slope of gamma_opt_phase vs. frequency. All of the variables Fa, Gma, Gmb, and Gp, are element values of the model, and are independent of frequency, so only one value or measurement is needed for each of them. Measurements of rn at all five frequencies are still required. This is a total of only 9 values and guarantees that both F min and Gamma_opt will follow the model criteria vs frequency. This is a large improvement over the prior art, which would need to determine all four noise parameters at all five frequencies, for a total of twenty values with no connection between frequencies. Of course, the improvement would be even greater when more frequencies are used. This example model uses a combination of model elements; model elements Fa, Gma, Gmb, and Gp are independent of the measurement parameter, frequency, while rn is determined separately for each measurement frequency.

In both examples, the exemplary solution may use over-determined noise raw data to reduce errors, and standard LMS routines which are well known in the art would be used to reduce the over-determined data to get the final solution.

Figure 10:
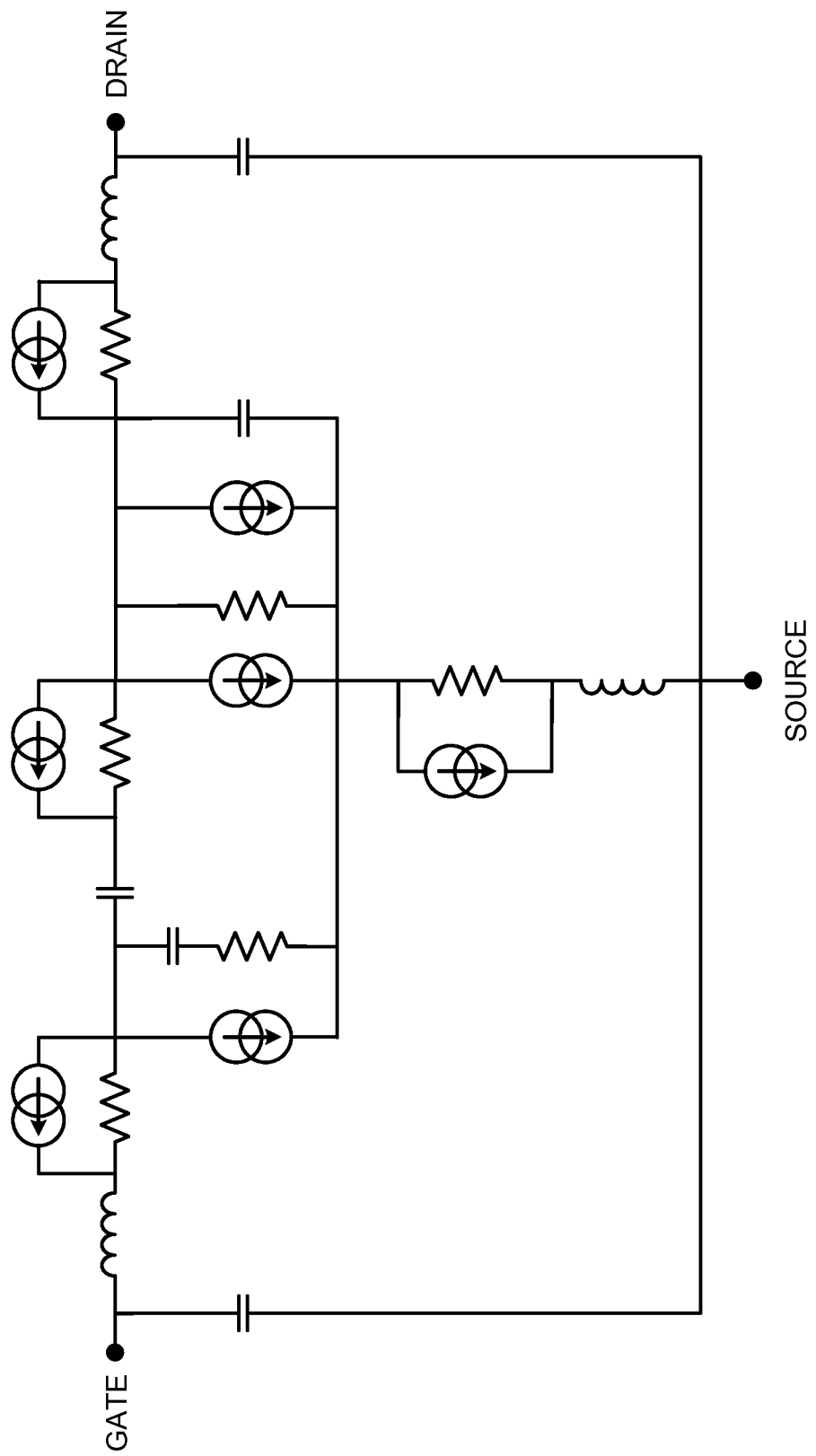
FIG. 10 is an example of an equivalent electrical schematic of the device model of an FET.

The prior example may be appropriate for some transistors or applications. But more complex models can have more detailed or complete information, especially for device performance vs. multiple measurement parameters. A typical example of a more complete FET equivalent circuit device model is shown in FIG. 10. The schematic may vary with different implementations, but the general intent is for the model to allow device performance to be calculated for a range of stimulus values. The device performance calculated with such a model will generally include gain and impedance data, as well as noise data. Many of the model element values having to do with gain performance may be determined with s-parameter vs. bias measurements. The noise portion of the model has generally been determined from noise parameters. In an exemplary implantation of the invention, the noise portion of the model would be determined from raw noise data instead of noise parameters.

Figure 11:
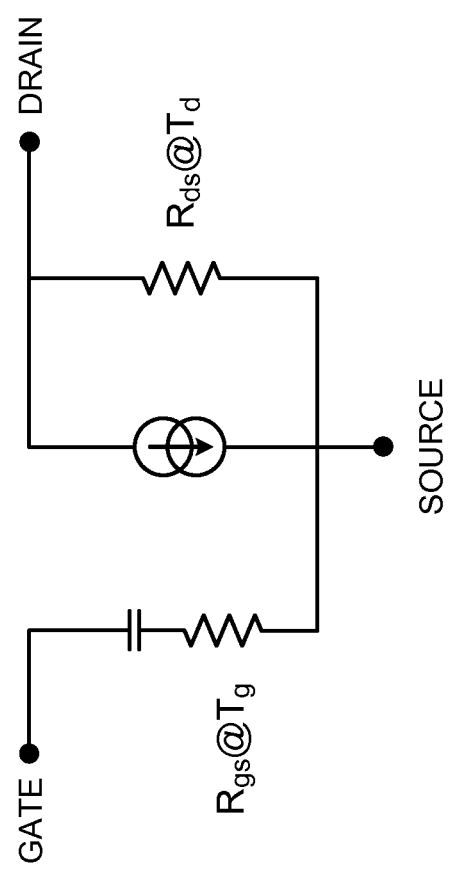
FIG. 11 is an equivalent electrical schematic of the Pospieszalski noise model of an intrinsic transistor.

The Pospieszalski equivalent circuit noise model, illustrated in FIG. 11, represents the intrinsic noise of the transistor with two model parameters or model element values Tg and Td. In the prior art, these model element values have been determined by fitting the model element values to previously determined noise parameters. In accordance with an embodiment of this invention, the device model element values are determined by fitting at least one of the device model element values to measured raw noise data.

Once the model element values are known, the noise parameters can then be determined, i.e. calculated from the model.

The noise parameters thus determined from any type of device model make use of information that was not used in the prior art to determine the noise parameters. The result is noise parameter data that more truly represents the performance of the DUT.

Another aspect of this invention is a more direct method of determining the element values of a device noise model. In the past, the element values of device noise models were fit to noise figure or noise parameters that were calculated from raw noise data.

In accordance with this aspect of the invention, the element values of a device model are fitted directly from the raw measured noise data instead of first calculating the corrected noise figure or noise parameters from raw noise data. The raw measured noise data that is available depends on the noise receiver that is used. For example, the raw measured noise data may be uncorrected readings from the noise receiver, which are typically proportional to power or voltage. Another example is that the raw measured noise data could comprise partially corrected data calculated by the noise receiver, such as noise figure not corrected for mismatches.

In accordance with another aspect, a subset of the measured data may be used for determination of the noise model element values. The subset of the measured data may be selected to remove data measured at impedances where the DUT is unstable or the measurement accuracy is reduced. As is known in the art, calibration or measurement uncertainty at some impedances may produce outlier data, which are inconsistent with true device performance and the majority of data. Also, some impedances can cause a device to oscillate, which would invalidate the measured data for those impedances. Multiple determinations of the model element values may be performed, with each determination comprising a calculation using a different subset of the measured data, and where the best results are kept as the final calculated noise model. In like fashion, a subset of the measured data may also be used to determine the noise parameters. In this case, the subset would first be used to determine the model element values, and the noise parameters then determined from the model.

Figure 12:
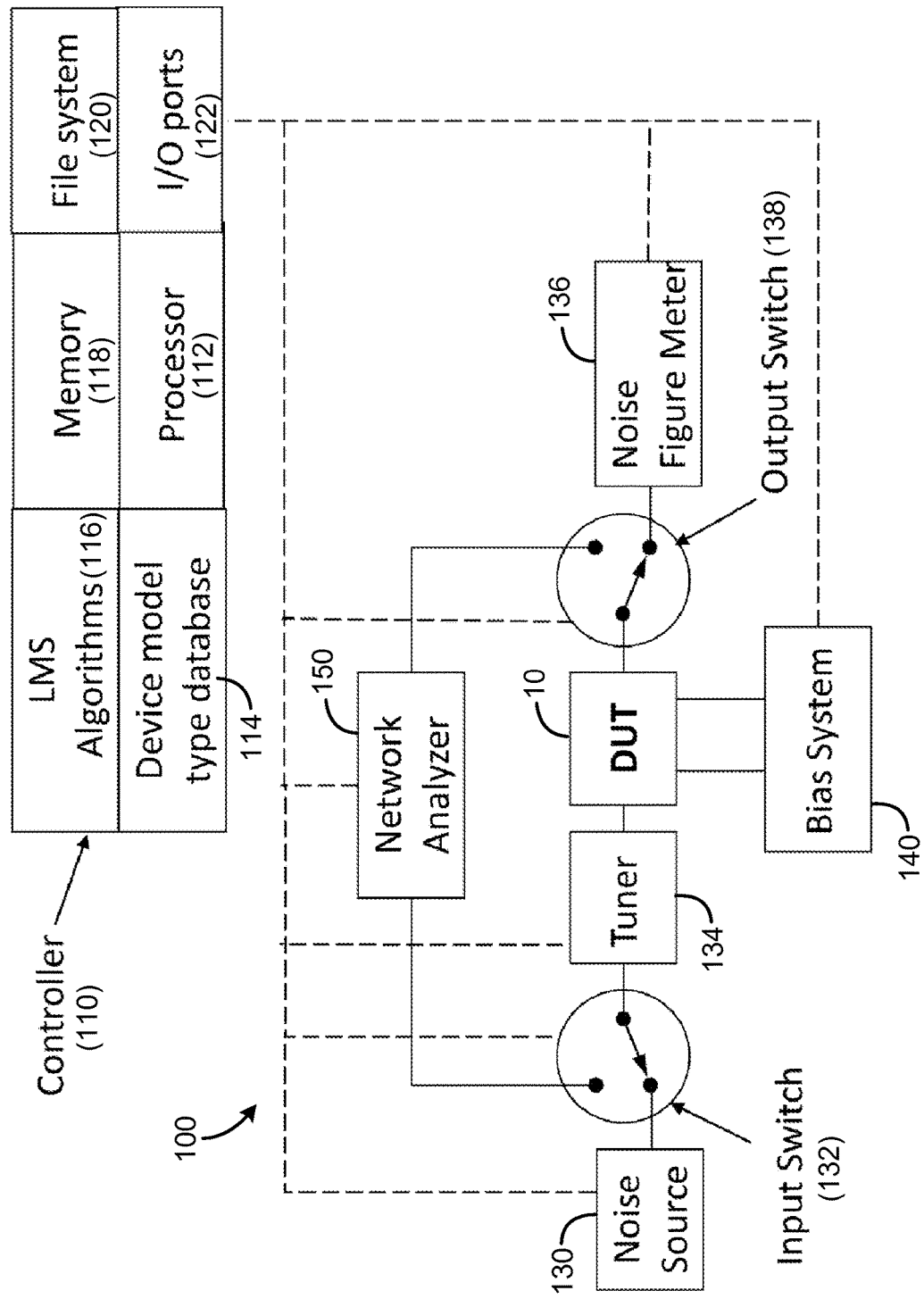
FIG. 12 is an exemplary noise parameter measurement setup. This setup can be used to determine a device noise model, and the DUT noise parameters may then be calculated from the device noise model.

A block diagram of an exemplary noise parameter measurement setup or system 100 is shown in FIG. 12. It includes a controller 110 that has a processor 112, a database 114 of device model types, Least Mean Squares algorithms 116 for fitting over-determined data, a digital memory (118), a file system 120 for saving data, and I/O ports 122 for communicating with and controlling the instruments in the system. As with the system of FIG. 1, the system 100 includes a noise source 130, a network analyzer 150, and an input switch 132 for connecting either the noise source or the network analyzer to the impedance tuner 134. The impedance tuner 134 is configured to present a variable impedance to the DUT 10, under control of the controller 110. Impedance tuners are well known in the art, e.g. as described in U.S. Pat. No. 8,890,750. A bias system 140 is connected to the DUT 10. The output side of the DUT is connected through output switch 138 to either a noise figure meter 136 or to the network analyzer 150. The noise figure meter is a stand-alone noise receiver. In some implementations, the noise receiver may be incorporated in the network analyzer, rather than being a stand-alone instrument. The solid lines indicate RF connections, and the dashed lines indicate control or communication connections. This controller 110 may comprise a computer, a stand-alone controller, or it may be built into one of the instruments, such as a network analyzer or a tuner. The controller will control the instruments 130, 132, 134, 136, 138, 140, 150 to setup the swept measurement parameters and measure the raw noise data. It will then use the model type selected from the device model type database by the user with the standard LMS algorithms to solve for the model values from over-determined data. Once the model element values are determined, the noise parameters can be calculated from the model. Such noise parameter calculations are known in the art, see, for example, "Modeling of Noise Parameters of MESFET'S and MODFET'S and Their Frequency and Temperature Dependence," Marian W. Pospieszalski, 1989 IEEE MTT-S Digest, pages 385-388; and "A New Method to Calculate the Pospieszalski Model Noise Parameters for a HEMT Transistor," Julian Chereches et al., International Symposium for Design and Technology of Electronic Packages, 14$^{th}$ Edition, ISSN 1843-5122, pages 101-105, 2008, pages 101-105.

The database of device model types provides the capability of selecting a noise model prior to calculating the noise parameters, an improvement over the prior art. The database may comprise one or more models; if only one type of DUT is to be measured, multiple model types in the database may not be necessary.

Figure 13:
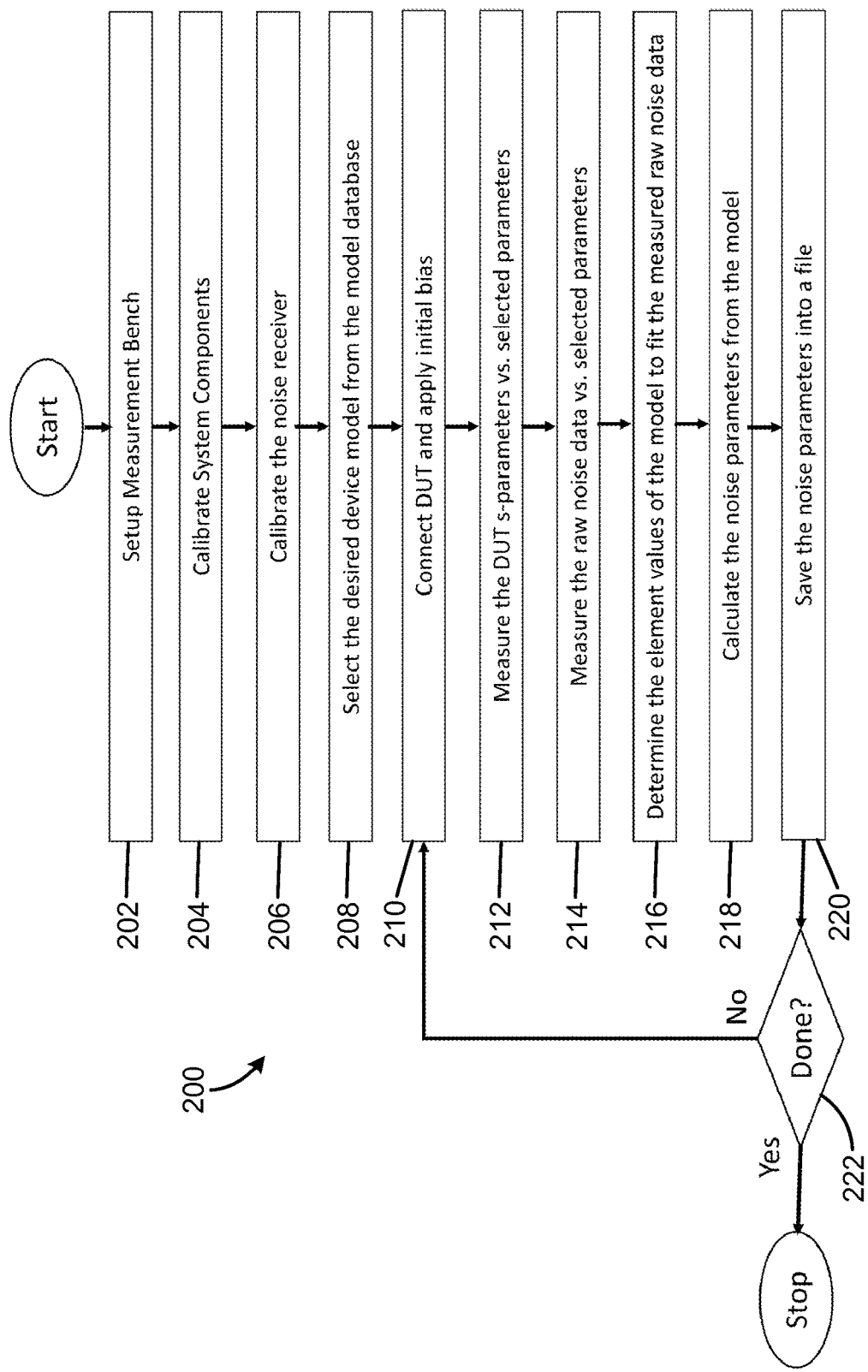
FIG. 13 is an exemplary flow diagram to measure noise parameters.

A flow chart of an exemplary noise parameter measurement procedure 200 in accordance with an embodiment of this invention is shown in FIG. 13. The measurement sequence includes the following steps.

1. Setup (202) the measurement bench with all of the required measurement equipment; an exemplary measurement bench or setup is illustrated in FIG. 12.
2. Calibrate (204) the system components in-situ.
3. Calibrate (206) the noise and gain parameters of the noise receiver.
4. Select (208) the desired device noise model type from the database of device noise models. Different devices may require different model types. Multiple model types may apply to the same DUT type. For example, some model types may be more complete, but require more work and measurements to develop. Other model types may be simpler, but less complete, yet sufficient for a given application.
5. Connect the DUT, and apply the initial DC bias (210).
6. Measure (212) the s-parameters of the DUT.
7. Measure (214) the raw noise data as a function of the selected measurement parameters, such as frequency, DC bias, or temperature.
8. Calculate (216) the element values of the selected device noise model that will give the best fit to the measured raw noise data.
9. From the device noise model with the element values determined in step 8 (216), calculate (218) the noise parameters of the DUT.
10. Save (220) the noise parameters in a noise data file.
11. If (222) there are more DUTs to measure, return to step 5 (210) and connect the next DUT.

Figure 14:
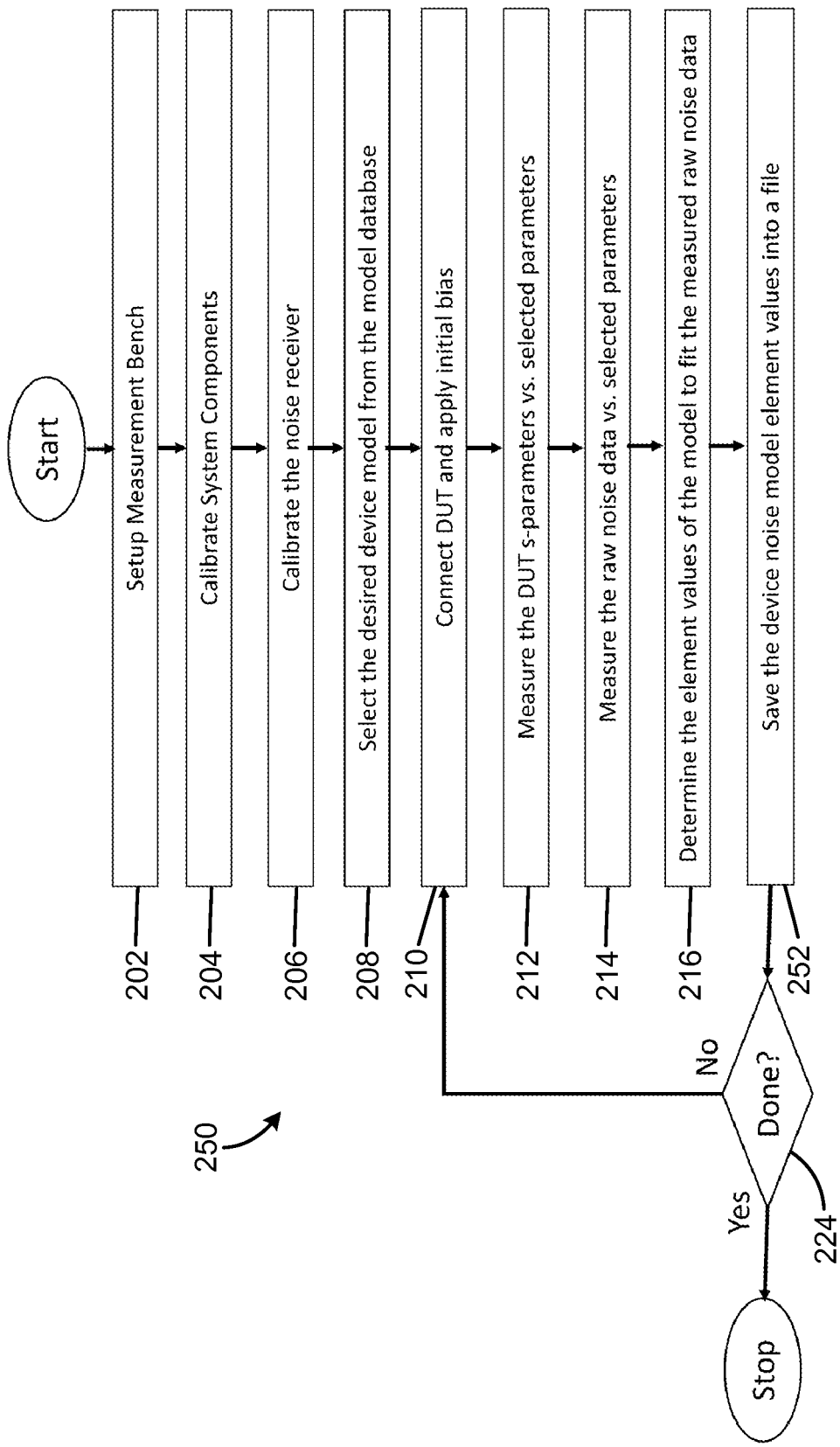
FIG. 14 is an exemplary flow diagram to measure a device noise model.

A variation of the flow diagram is shown in FIG. 14. This may be used if the desired measured output is the device model, and noise parameters are not explicitly required. FIG. 14 is the same as FIG. 13, with the same reference numbers referring to the same steps as in FIG. 13, except that when the model is determined, the model parameters are saved (252), and the step of calculating the noise parameters is skipped.

Another exemplary variation of the flow diagram would be to combine FIG. 13 and FIG. 14, and save both the device noise model and the noise parameters.

Although the foregoing has been a description and illustration of specific embodiments of the subject matter, various modifications and changes thereto can be made by persons skilled in the art without departing from the scope and spirit of the invention.

What is claimed is:

1. A method of measuring noise data and determining element values of a device noise model for a device under test (DUT) using a test system with instruments including an impedance tuner coupled to an input of the DUT for presenting a controllable variable impedance to the DUT and a noise receiver coupled to an output of the DUT, the test system instruments under control of a controller including a processor, the method comprising:
   measuring raw noise data with the noise receiver regarding the DUT as a function of at least one measurement parameter using the test system over a measurement range of the measurement parameter;
   storing the measured raw noise data in a memory;
   processing the stored measured noise data to determine element values of the device noise model by applying a fitting algorithm to fit the element values to the measured raw data, and where the measured data comprises raw noise data read from the noise receiver, and where the measured data does not comprise noise parameters of the DUT; and
   wherein the device noise model with the determined element values represents noise performance of the DUT which is not limited to the measurement range of the measurement parameter during the measurement step, and the noise model is configured to predict noise contribution of the DUT without scatter due to measurement errors.

2. The method of claim 1, where the device noise model is a device response model.

3. The method of claim 2, where the device response model includes knowledge that the noise parameters should vary smoothly as a function of a measurement parameter value.

4. The method of claim 3, wherein said response model further comprises information about how the noise parameters vary as a function of multiple measurement parameters.

5. The method of claim 1, where the at least one measurement parameter is frequency.

6. The method of claim 1, where the at least one measurement parameter is a bias value.

7. The method of claim 1, where the at least one measurement parameter is temperature.

8. The method of claim 1, further comprising:
   using the device element values to calculate noise parameters of the DUT from the device noise model.

9. The method of claim 8, where a subset of the measured data is used for the noise parameter determination.

10. The method of claim 9, where the subset of the measured data is selected to remove data measured at impedances where the device is unstable or the measurement accuracy is reduced.

11. The method of claim 9, comprising:
    performing multiple calculations of the noise parameter data, with each calculation using a different subset of the measured data, and where the best results are kept as the final calculated noise parameters.

12. The method of claim 1, where a subset of the measured data is used for determination of the noise model element values.

13. The method of claim 12, where the subset of the measured data is selected to remove data measured at impedances where the device is unstable or the measurement accuracy is reduced.

14. The method of claim 12, where multiple determinations of the noise element values are performed, with each determination comprising a calculation using a different subset of the measured data, and where the best results are kept as the final calculated noise model.

15. The method of claim 1, wherein said measuring noise data comprises:
    under control of the controller,
    (i) setting the impedance tuner to a first state;
    (ii) measuring the noise data for all values of the at least one measurement parameter with the impedance tuner at said first state;
    (iii) setting the impedance tuner to another state;
    (iv) measuring the noise data for said all values with the impedance tuner at said another state;
    (v) repeating steps (iii) and (iv) until the noise data has been measured for every desired impedance tuner state.

16. The method of claim 1, wherein said measuring noise data comprises:
    under control of the controller,
    (i) setting the impedance tuner to a first state;
    (ii) measuring the noise data for a first value of the at least one measurement parameter with the impedance tuner at said first state;
    (iii) setting the impedance tuner to another state;
    (iv) measuring the noise data for said one value of the at least one measurement parameter with the impedance tuner at said another state;
    (v) repeating steps (iii) and (iv) until the noise data has been measured for every desired impedance tuner state
    (vi) repeating steps (i) through (v) for each desired value of the at least one measurement parameter.

17. A system for measuring noise data of a device under test (DUT) and determining noise model element values, comprising:
    an impedance tuner coupled to an input of the DUT for presenting a controllable, variable impedance to the DUT;
    a bias system for providing bias signals to the DUT;
    a noise receiver coupled to an output of the DUT; and
    a controller coupled to the impedance tuner and the noise receiver for controlling measurement parameters of the system, the controller comprising:
    a processor;
    a memory for storing measurement data;
    a device model type database storing at least one device model type;
    and
    a fitting algorithm;
    the processor configured to control the test system to carry out noise data measurements on the DUT and to determine element values of the device model from raw data obtained from the measurements on the DUT by applying the fitting algorithm to the measured raw data; and
    wherein the device noise model with the determined element values represents noise performance of the DUT which is not limited to the measurement range of the measurement parameter during the measurement step, and the noise model is configured to predict noise contribution of the DUT without scatter due to measurement errors.

18. The system of claim 17, wherein the processor is further configured to determine a set of noise parameters from the device model with the determined element values.

19. The system of claim 17, wherein the at least one device model type includes a response model type or an equivalent circuit model type.

20. A method of measuring data for a device under test (DUT) using a test system with instruments including an impedance tuner coupled to an input of the DUT for presenting a controllable variable impedance to the DUT and a noise receiver coupled to an output of the DUT, the test system further including a controller for controlling the instruments, the controller including a processor, a memory, a device model type database and a fitting algorithm, the method comprising:

connecting the DUT to the test system and applying an initial bias to the DUT;

measuring the DUT s-parameters as a function of one or more selected measurement parameters;

measuring noise data regarding the DUT as a function of one or more selected noise measurement parameters;

storing the measured noise data in the memory;

determining element values of a device noise model stored in the database by applying the fitting algorithm to fit the measured noise data, and where the measured data comprises raw noise data read from the noise receiver, and where the measured data does not comprise noise parameters of the DUT; and wherein the device noise model with the determined element values represents noise performance of the DUT which is not limited to the measurement range of the measurement parameter during the measurement step, and the noise model is configured to predict noise contribution of the DUT without scatter due to measurement errors.

21. The method of claim 20, further comprising:
calculating noise parameters for the DUT from the device noise model.

22. The method of claim 20, wherein said measuring noise data comprises measuring data directly from the test system equipment.

23. The method of claim 20, wherein said noise measurement parameters include one or more of frequency, bias and temperature.

* * * * *